(12) United States Patent
Yi et al.

(10) Patent No.: US 10,490,623 B2
(45) Date of Patent: *Nov. 26, 2019

(54) SEMICONDUCTOR DEVICE INCLUDING A PLURALITY OF ELECTRODES AND SUPPORTERS

(71) Applicant: Samsung Electronics Co., Ltd., Suwon-si, Gyeonggi-do (KR)

(72) Inventors: Ha-young Yi, Seongnam-si (KR);
Youn-seok Choi, Seoul (KR);
Young-min Ko, Hwaseong-si (KR);
Mun-jun Kim, Suwon-si (KR);
Hong-gun Kim, Hwaseong-si (KR);
Seung-heon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/229,950

(22) Filed: Dec. 21, 2018

(65) Prior Publication Data

US 2019/0131386 A1   May 2, 2019

Related U.S. Application Data

(63) Continuation of application No. 15/601,186, filed on May 22, 2017, now Pat. No. 10,170,541.

(30) Foreign Application Priority Data

May 27, 2016 (KR) .................. 10-2016-0065697

(51) Int. Cl.
*H01L 49/02* (2006.01)
*H01L 27/108* (2006.01)

(52) U.S. Cl.
CPC ........ *H01L 28/90* (2013.01); *H01L 27/10808* (2013.01); *H01L 27/10814* (2013.01);
(Continued)

(58) Field of Classification Search
CPC ....... H01L 49/02; H01L 27/108; H01L 28/90; H01L 27/10808; H01L 28/87; H01L 27/10855; H01L 27/10814
(Continued)

(56) References Cited

U.S. PATENT DOCUMENTS 8,003,480 B2   8/2011   Huang et al.
8,169,012 B2   5/2012   Bae et al.
(Continued)

FOREIGN PATENT DOCUMENTS

JP   H10-242430 A   9/1998
JP   2013-045894 A   3/2013
(Continued)

*Primary Examiner* — Alexander O Williams
(74) *Attorney, Agent, or Firm* — Harness, Dickey & Pierce, P.L.C.

(57) ABSTRACT

A semiconductor device includes a plurality of electrode structures formed on a substrate; and an upper supporter group and a lower supporter between upper ends and lower ends of the plurality of electrode structures The upper supporter group includes a plurality of supporters, and at least some of the plurality of supporters each have an upper surface and a lower surface. One of the upper surface and the lower surface has a curved profile, and the other surface has a flat profile.

20 Claims, 15 Drawing Sheets

(52) U.S. Cl.
CPC ........ *H01L 27/10855* (2013.01); *H01L 28/87* (2013.01); *H01L 28/91* (2013.01)

(58) Field of Classification Search
USPC ........................................................ 257/773
See application file for complete search history.

(56) References Cited

U.S. PATENT DOCUMENTS

| | | | |
|---|---|---|---|
| 8,912,629 | B2 | 12/2014 | Seo |
| 9,053,971 | B2 | 6/2015 | Park et al. |
| 9,331,140 | B2 | 5/2016 | Park et al. |
| 2011/0306197 | A1 | 12/2011 | Kim et al. |
| 2013/0005110 | A1 | 1/2013 | Yoon et al. |
| 2013/0228837 | A1 | 9/2013 | Sukekawa et al. |
| 2014/0145303 | A1 | 5/2014 | Kim et al. |
| 2015/0102462 | A1 | 4/2015 | Seo |
| 2015/0236084 | A1 | 8/2015 | Park et al. |
| 2016/0064277 | A1 | 3/2016 | Park et al. |
| 2017/0077102 | A1 | 3/2017 | Kim et al. |
| 2017/0345886 | A1 * | 11/2017 | Yi .................... H01L 27/10808 |

FOREIGN PATENT DOCUMENTS

| | | |
|---|---|---|
| KR | 2011-0136473 A | 12/2011 |
| KR | 2012-0007255 A | 1/2012 |
| KR | 2012-0104810 A | 9/2012 |
| KR | 10-1262225 B1 | 5/2013 |
| KR | 2013-0062161 A | 6/2013 |
| KR | 2014-0048505 A | 4/2014 |
| KR | 2014-0051688 A | 5/2014 |
| KR | 2014-0055366 A | 5/2014 |
| KR | 2014-0070739 A | 6/2014 |

* cited by examiner

SEMICONDUCTOR DEVICE INCLUDING A PLURALITY OF ELECTRODES AND SUPPORTERS

CROSS-REFERENCE TO RELATED APPLICATION

This application is a continuation of U.S. application Ser. No. 15/601,186, filed on May 22, 2017, which claims the benefit of Korean Patent Application No. 10-2016-0065697, filed on May 27, 2016, in the Korean Intellectual Property Office, the disclosure of each of which is incorporated herein in its entirety by reference.

BACKGROUND

Example embodiments of the inventive concepts relate to a semiconductor device. For example, at least some example embodiments relate to a semiconductor device including a capacitor.

Recently, as capacities of semiconductor devices such as dynamic random access memory (DRAM) have increased and semiconductor devices have been highly integrated, the design rule has been continuously reduced. In order to operate a DRAM device, it may be desirable for a capacitance per one cell to be greater than or equal to a threshold level. To do this, research into a method of using a high-k material as a dielectric layer, a method of reducing a thickness of a dielectric layer, and/or a method of increasing a contact area between a lower electrode of a capacitor and a dielectric layer is being conducted.

SUMMARY

Example embodiments of the inventive concepts provide a semiconductor device having improved capacitance by increasing a contact area between a lower electrode of a capacitor and a dielectric layer.

According to an example embodiment of the inventive concepts, there is provided a semiconductor device including: a plurality of electrode structures on a substrate; and an upper supporter group and a lower supporter between upper ends and lower ends of the plurality of electrode structures, wherein the upper supporter group includes a plurality of upper supporters, at least some of the plurality of upper supporters each having an upper surface and a lower surface, wherein a first one of the upper surface and the lower surface has a curved profile, and a second one of the upper surface and the lower surface has a flat profile.

According to another example embodiment of the inventive concepts, there is provided a semiconductor device including: a plurality of electrode structures on a substrate with which a plurality of unit devices are associated; a first supporter, a second supporter, and a third supporter separated from one another between upper ends and lower ends of the plurality of electrode structures; a dielectric layer on the plurality of electrode structures; and an upper electrode on the dielectric layer, wherein an upper surface of the first supporter or a lower surface of the second supporter have curved profiles, and a lower surface of the first supporter and an upper surface of the second supporter have relatively flat profiles as compared with the upper surface of the first supporter or the lower surface of the second supporter.

According to another example embodiment of the inventive concepts, there is provided a semiconductor device including: a substrate; an electrode perpendicular to the substrate; a first supporter having a top surface and a bottom surface, the bottom surface of the first supporter being substantially parallel to the substrate such that the bottom surface of the first supporter is connected substantially at right angles to the electrode, the top surface having a different profile from the bottom surface; and a second supporter having a top surface and a bottom surface, the second supporter being closer to the substrate than the first supporter, the top surface of the second supporter being substantially parallel to the substrate such that the top surface of the second supporter is connected substantially at right angles to the electrode, the bottom surface having a different profile from the top surface.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
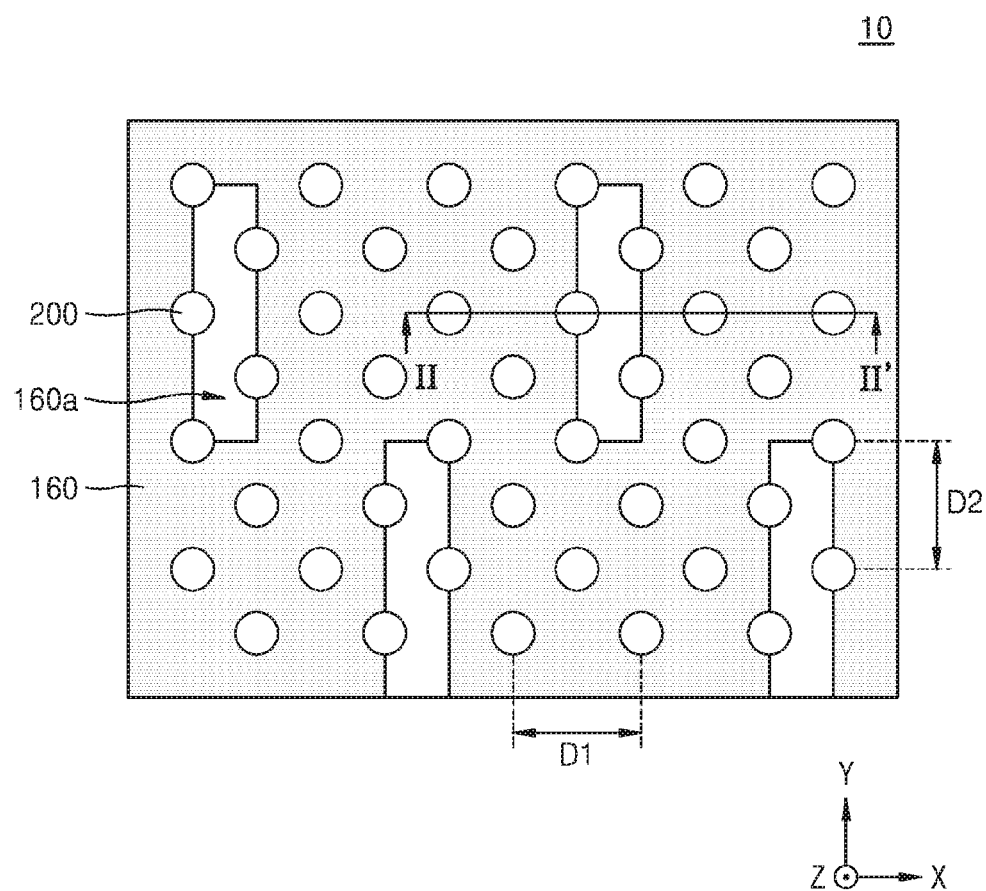
FIG. 1 is a schematic plan view showing arrangements of electrode structures and a supporter in a semiconductor device according to an example embodiment.

Example embodiments will be described in detail with reference to the accompanying drawings. Example embodiments, however, may be embodied in various different forms, and should not be construed as being limited only to the illustrated example embodiments. Rather, these example embodiments are provided as examples so that this disclosure will be thorough and complete, and will fully convey the concept of the example embodiments to those skilled in the art. Accordingly, known processes, elements, and techniques are not described with respect to some of the example embodiments. Unless otherwise noted, like reference numerals denote like elements throughout the attached drawings and written description, and thus descriptions will not be repeated. In the drawings, the sizes and relative sizes of layers and regions may be exaggerated for clarity.

FIG. 1 is a schematic plan view showing arrangements of electrode structures and a supporter in a semiconductor device 10 according to an example embodiment.

Figure 2:
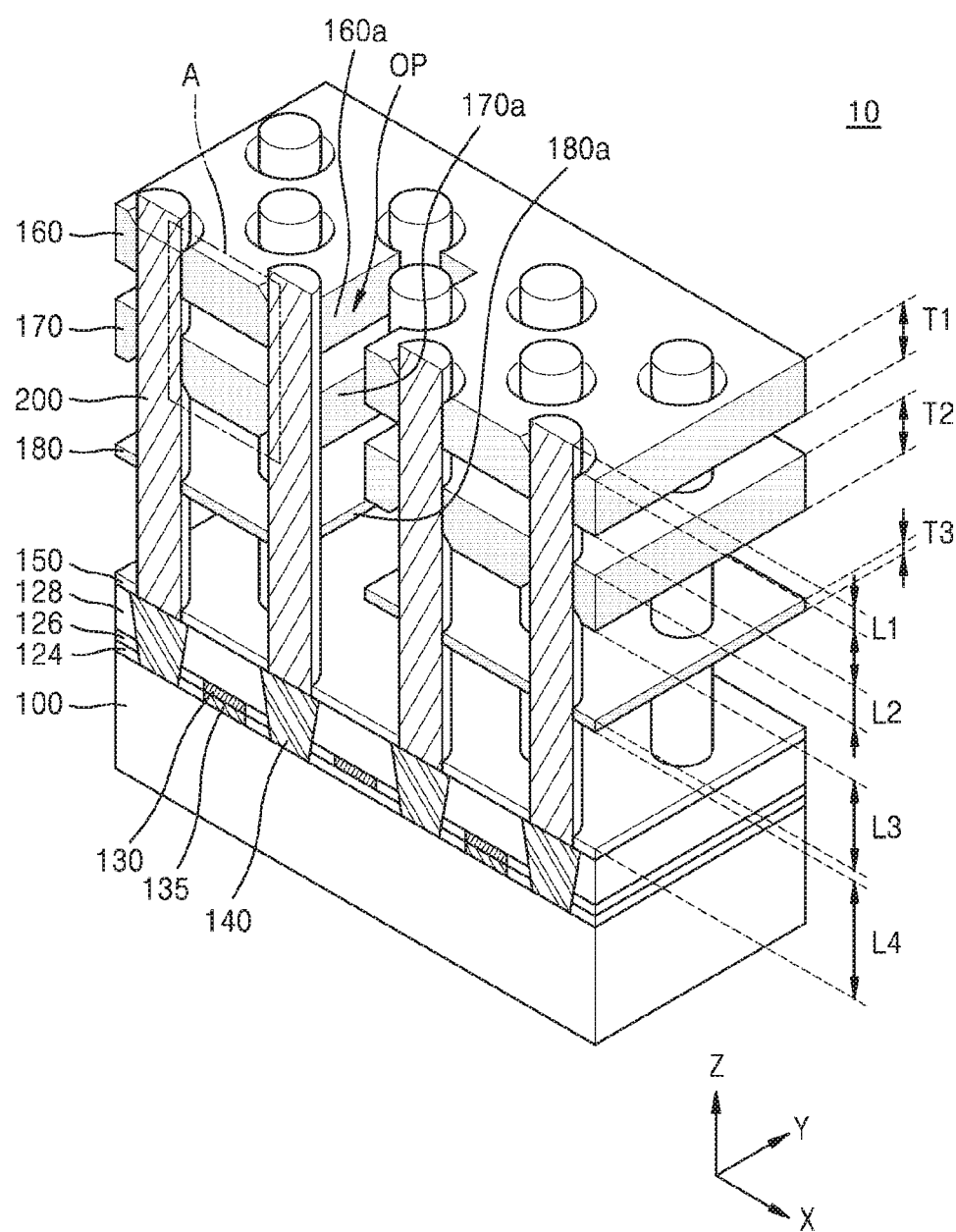
FIG. 2 is a schematic perspective view showing some elements of the semiconductor device of FIG. 1.

FIG. 2 is a schematic perspective view showing some elements of the semiconductor device 10 of FIG. 1.

The semiconductor device 10 of FIGS. 1 and 2 may be applied to a capacitor of dynamic random access memory (DRAM), but is not limited thereto.

Referring to FIGS. 1 and 2, the semiconductor device 10 includes a substrate 100, a plurality of bit lines 130 and a plurality of electrode structures 200 arranged on the substrate 100. The semiconductor device 10 may further include a plurality of gate lines (not shown) disposed in the substrate 100 or on the substrate 100.

The substrate 100 may include a rigid substrate such as a silicon substrate, a silicon on insulator (SOI) substrate, a gallium arsenic substrate, a silicon germanium substrate, a ceramic substrate, a quartz substrate, and a glass substrate for a display, or a flexible plastic substrate including polyimide, polyester, polycarbonate, polyethersulfone, polymethyl methacrylate, polyethylene naphthalate, or polyethylene terephthalate.

Device isolation layers (not shown) may be formed on the substrate 100 for separating a plurality of gate lines (not shown). The substrate 100 may include unit devices (not shown) such as active devices or passive devices of various kinds for forming semiconductor devices. The unit devices may be, for example, DRAM cell transistors.

First to third insulating layers 124, 126, and 128 and an etch stop layer 150 are sequentially stacked on the substrate 100. The first to third insulating layers 124, 126, and 128 may include, for example, silicon oxide such as borosilicate glass (BSG), phosphosilicate glass (PSG), borophosphosilicate glass (BPSG), undoped silicate glass (USG), tetraethylorthosilicate glass (TEOS), and/or high density plasma-chemical vapour deposition (HDP-CVD). The etch stop layer 150 may include SiON or SiN. In some example embodiments, the etch stop layer 150 may be omitted.

Each of the plurality of bit lines 130 may extend in a direction that is perpendicular to a direction, in which the gate lines (not shown) extend, e.g., a y-axis direction, in the second insulating layer 126. In some example embodiments, the bit line 130 may be arranged in the substrate 100 as an embedded bit line. The bit line 130 may be electrically connected to the substrate 100 via a direct contact plug 135 that penetrates through the first and second insulating layers 124 and 126. The bit line 130 and the direct contact plug 135 may respectively include a conductive material, e.g., tungsten (W), titanium (Ti), aluminum (Al), copper (Cu), tantalum (Ta), tungsten nitride (WNx), titanium nitride (TiNx), aluminum nitride (AlNx), tantalum nitride (TaNx), and titanium-aluminum nitride (TiAlxNy). Otherwise, the bit line 130 and the direct contact plug 135 may include doped polysilicon.

The plurality of electrode structures 200 may be repeatedly arranged on the substrate 100 along an x-axis direction and the y-axis direction, as shown in FIG. 1. As shown in FIG. 1, the plurality of electrode structures 200 may be separated from one another in the x-axis direction at an interval of a first pitch D1, and may be separated from one another in the y-axis direction at an interval of a second pitch D2. In FIG. 1, the first pitch D1 is shown to be nearly equal to the second pitch D2, but is not limited thereto.

The electrode structures 200 may be arranged as a honeycomb-like structure, in which the electrode structures 200 in adjacent columns or rows cross each other. When the electrode structures 200 cross each other, distances between adjacent electrode structures 200 may be constant.

The electrode structures 200 may have thin and long shapes that extend in a direction that is perpendicular to the x and y-axis directions, e.g., z-axis direction, on the substrate 100. The electrode structures 200 may have an aspect ratio, that is, a ratio of a height with respect to a width, of about 10 to about 35, but are not limited thereto.

In an example embodiment, the electrode structures 200 are shown as pillars, but in some other example embodiments, the electrode structures 200 may have hollow cylindrical shapes. A 'pillar type' may denote a cylinder with a filled inside, as shown in FIG. 2, and a 'hollow cylindrical type' may denote a cylinder with an empty inside. The electrode structures 200 may include, for example, at least one of doped polysilicon, TiN, W, Ti, Ru, and WN. The electrode structures 200 may include an oxide-based conductive material such as ruthenium oxide (RuOx). The electrode structures 200 may be formed by a sputtering process, a physical vapour deposition (PVD) process, and an atomic layer deposition (ALD) method, but example embodiments of the inventive concepts are not limited thereto.

Each of the electrode structures 200 may be connected to a source/drain region (not shown) in the substrate 100 via a capacitor contact plug 140 in a certain region. In an example embodiment, the electrode structure 200 is directly connected to the substrate 100 via the capacitor contact plug 140, but example embodiments of the inventive concepts are not limited thereto. The electrode structure 200 may be connected to the substrate 100 via, for example, at least one contact pad (not shown) and/or at least one contact plug (not shown).

The number of electrode structures 200 may be greater or less than that of electrode structures 200 shown in FIG. 1. In an example embodiment, the electrode structure 200 may correspond to a lower electrode of the capacitor. However, one or more example embodiments are not only applied to the lower electrode of the cell capacitor in DRAM, but may be also applied to structures having high aspect ratios and arranged repeatedly.

A first supporter 160, a second supporter 170, and a third supporter 180 may be located between uppermost and lowermost ends of the plurality of electrode structures 200. The first to third supporters 160, 170, and 180 may prevent inclination of the electrode structures 200 having a large aspect ratio. The first and second supporters 160 and 170 may form an upper supporter group, and the third supporter 180 may form a lower supporter. The first to third supporters 160, 170, and 180 may support the electrode structures 200 by partially supporting side surfaces of the electrode structures 200. The first to third supporters 160, 170, and 180 may include plates that are arranged in parallel with an upper surface of the substrate 100 at certain heights on the electrode structures 200.

The first to third supporters 160, 170, and 180 may respectively include first to third openings 160a, 170a, and 180a. The first to third openings 160a, 170a, and 180a may be repeatedly and regularly formed in the first to third supporters 160, 170, and 180. In some example embodiments, the first to third openings 160a, 170a, and 180a may be different from one another in locations, sizes, or shapes thereof. The first to third openings 160a, 170a, and 180a may have a shape, a length of which in the x-axis direction is three times greater than the first pitch D1 and a length of which in the y-axis direction is equal to the second pitch D2, but example embodiments are not limited thereto. That is, the first to third openings 160a, 170a, and 180a may be formed as a parallelogram, a trapezoid, a triangle, or a circle.

Post-processes on portions under the first to third supporters 160, 170, and 180 may be performed via the first to third openings 160a, 170a, and 180a. As an example of such post-processes, a first, second, and third mold layers 152, 154, and 156 (see FIG. 4), formed respectively under the first to third supporters 160, 170, and 180 may be removed and/or a dielectric layer 202 (see FIG. 12) and an upper electrode 204 (see FIG. 12) may be formed on surfaces of the electrode structures 200 when the electrode structure 200 is the lower electrode of the cell capacitor in the DRAM.

As shown in FIG. 2, the first to third supporters 160, 170, and 180 may be disposed at certain heights of the electrode structure 200. For example, the first and second supporters 160 and 170 may be separated from opposite ends of the electrode structure 200 in the z-axis direction and located along the center of the electrode structure 200 in the z-axis direction. The first and second supporters 160 and 170 may be separated from each other in the z-axis direction. In some example embodiments, the first supporter 160 may be formed slightly under an upper end portion of the electrode structure 200.

In addition, the third supporter 180 may be located at a lower end, that is, lower than an intermediate portion of the electrode structure 200. As such, the electrode structure 200 may have a side surface that is exposed by a fourth height L4 under the third supporter 180, and a side surface that is exposed by a third height L3 between the third supporter 180 and the second supporter 170. The fourth height L4 may be equal to or greater than the third height L3. In addition, the electrode structure 200 may have a side surface that is exposed by a second height L2 between the second supporter 170 and the first supporter 160, and a side surface that is exposed to a first height L1 above the first supporter 160. The first height L1 may be less than the second height L2, and the second height L2 may be less than the third height L3.

In some example embodiments, an upper surface of the first supporter 160 and an upper surface of the electrode structures 200 may be at the same level so that the electrode structures 200 may not protrude upward. In addition, the number of supporters is not limited to the above example, and four or more supporters may be arranged.

The first and second supporters 160 and 170 may include the same material as each other. A thickness T1 of the first supporter 160 and a thickness T2 of the second supporter 170 may be equal to or different from each other. In some other embodiments, the first supporter 160 and the second supporter 170 both may have multi-layered structures.

The first and second supporters 160 and 170 may include a material that has etch selectivity with respect to the first, second, and third mold layers 152, 154, and 156 (see FIG. 4) for forming the electrode structures 200. In some example embodiments, a limulus amoebocyte lysate (LAL) lift-off process is used in a post-process for removing the first, second, and third mold layers 152, 154, and 156, a material having a low etch rate with respect to the LAL and having dielectric characteristics may be used. For example, the first and second supporters 160 and 170 may include one of SiN, SiCN, TaO, and TiO$_2$, but are not limited thereto.

In one example embodiment, the first and second supporters 160 and 170 may include SiCN, or silicon carbon nitride. In silicon carbon nitride, a carbon rate may range from 0.1 atom % to 15 atom %. If the first and second supporters 160 and 170 include carbon, warpage of the first and second supporters 160 and 170 may be reduced.

A thickness T3 of the third supporter 180 may be less than those T1 and T2 of the first and second supporters 160 and 170. In some example embodiments, the third supporter 180 may have a multi-layered structure. The third supporter 180 may include a material having etch selectivity with respect to the first, second, and third mold layers 152, 154, and 156 (see FIG. 4) for forming the electrode structures 200. In some example embodiments, in a case where the LAL lift-off process is used in a post-process for removing the first, second, and third mold layers 152, 154, and 156, a material having a low etch rate with respect to the LAL and having dielectric characteristics may be used. For example, the third supporter 180 may include one of SiN, SiCN, TaO, and TiO$_2$, but is not limited thereto.

In one example embodiment, the third supporter 180 may include SiCN, or silicon carbon nitride. In silicon carbon nitride, a carbon rate may range from 0.1 atom % to 15 atom %. If the third supporter 180 includes carbon, warpage of the third supporter 180 may be reduced.

Figure 3:
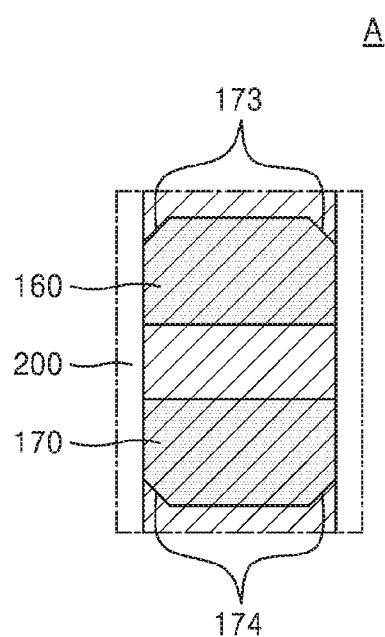
FIG. 3 is a cross-sectional view of a part of the semiconductor device of FIG. 2.

FIG. 3 is a cross-sectional view showing an enlarged view of region A in FIG. 2.

Referring to FIG. 3, an upper surface of the first supporter 160 and a lower surface of the second supporter 170 may respectively have a profile that varies depending on a distance to the electrode structure 200. Due to the variation in the profile, the thickness of the first supporter 160 and the second supporter 170 may be reduced towards the electrode structures 200.

A first damaged portion 173 may be formed in the upper surface of the first supporter 160, and a second damaged portion 174 may be formed in the lower surface of the second supporter 170. The first damaged portion 173 may be generated due to dry etching and/or wet etching during the processes, and the second damaged portion 174 may be generated due to the wet etching during the processes.

Unlike the upper surface of the first supporter 160 and the lower surface of the second supporter 170 respectively having the first and second damaged portions 173 and 174, a lower surface of the first supporter 160 and an upper surface of the second supporter 170 may have relatively flat profiles. That is, during the manufacturing processes of the semiconductor device according to the example embodiments, the third mold layer 156 (see FIG. 4) formed between the first supporter 160 and the second supporter 170 may protect the lower surface of the first supporter 160 and the upper surface of the second supporter 170 against damage caused by the etching process so that the lower surface of the first supporter 160 and the upper surface of the second supporter 170 may have flat profiles. Accordingly, a contact area between the supporters and the electrode structures 200 increases when being compared with the shape caused by the etching damage, margins with respect to isolation of the supporters or cracks may be improved. In addition, in one example embodiment, when the first and second supporters 160 and 170 include SiCN and the third mold layer 156 (see FIG. 4) includes SiN, the third mold layer 156 prevents a bowing effect, or curvature, from being generated in the side surface portion of the electrode structure 200 exposed between the first and second supporters 160 and 170 during a post wet-etching process, and accordingly, the side surface portion of the electrode structure 200 may have a constant profile.

FIGS. 4 to 12 are cross-sectional views of a method of manufacturing a semiconductor device, according to an example embodiment. FIGS. 4 to 12 respectively show cross-sectional structures corresponding to a cross-section taken along a line II-II' of FIG. 1.

Figure 4:
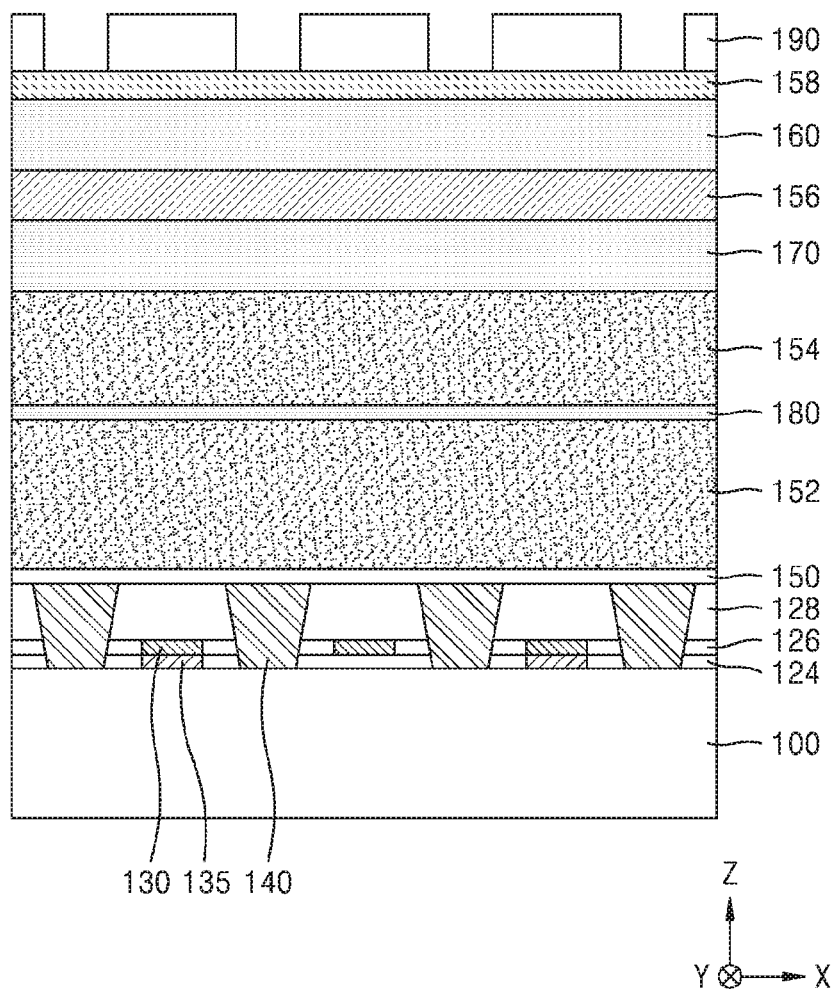
FIGS. 4 to 12 are cross-sectional view of a method of manufacturing a semiconductor device, according to an example embodiment, in a processing order.

Referring to FIG. 4, a substrate 100, on which a plurality of bit lines 130, a plurality of capacitor contact plugs 140, and a plurality of gate lines (not shown) are formed, is provided.

Device isolation layers (not shown) for separating the plurality of gate lines (not shown) may be formed on the substrate 100. The substrate 100 may include unit devices (not shown) that are necessary for forming a semiconductor device such as active devices or passive devices of various kinds. The unit devices may be, for example, dynamic random access memory (DRAM) cell transistors.

The first to third insulating layers 124, 126, and 128 and the etch stop layer 150 may be sequentially stacked on the upper surface of the substrate 100. The first to third insulating layers 124, 126, and 128 may include, for example, silicon oxide such as borosilicate glass (BSG), PhosphoSilicate glass (PSG), BoroPhosphoSilicate Glass (BPSG), Undoped Silicate Glass (USG), TetraEthlyOrthoSilicate Glass (TEOS), or High Density Plasma-CVD (HDP-CVD). In some example embodiments, the etch stop layer 150 may be omitted.

The bit lines 130 may extend in a direction that is perpendicular to a direction, in which the gate lines (not shown) extend, for example, in a y-axis direction, in the second insulating layer 126. In some example embodiments, the bit lines 130 may be arranged in the substrate 100 as embedded bit lines. The bit lines 130 may be electrically connected to the substrate 100 via direct contact plugs 135 that penetrate through the first and second insulating layers 124 and 126. The bit lines 130 and the direct contact plugs 135 may respectively include a conductive material, for example, W, Ti, Al, Cu, Ta, tungsten nitride (WNx), titanium nitride (TiNx), aluminum nitride (AlNx), tantalum nitride (TaNx), and titanium-aluminum nitride (TiAlxNy). Otherwise, the bit lines 130 may include doped polysilicon.

A stack structure, in which the first mold layer 152, the third supporter 180, the second mold layer 154, the second supporter 170, the third mold layer 156, the first supporter 160, and the hard mask layer 158 are sequentially stacked, is formed on the etch stop layer 150. A first mask pattern 190 for forming the electrode structures 200 (see FIG. 2) may be formed on the stack structure.

The first to third supporters 160, 170, and 180 may include SiCN. In a case where the first to third supporters 160, 170, and 180 include a carbon-based material layer, warpage characteristics of the first to third supporters 160, 170, and 180 may be reduced. In order to prevent loss caused by plasma damage, the carbon-based material layer may include carbon at an appropriate rate. For example, the carbon-based material layer may include carbon of 0.1 atom % to 15 atom %.

A processing condition for forming the first to third supporters 160, 170, and 180 may range from 250° C. to 550° C., and may use a mixture gas of $SiH_4$ and $NH_3$. In addition, $N_2$ may be used or $N_2$ and He may be used together as a carrier gas.

The first mold layer 152 and the second mold layer 154 may include a material having etch selectivity with respect to the second supporter 170 and the third supporter 180. In some example embodiments, when a LAL lift-off process is performed, the first mold layer 152 and the second mold layer 154 may respectively include an oxide layer having a high etch rate with respect to the LAL, but example embodiments are not limited thereto.

The third mold layer 156 may include a material having etch selectivity with respect to the first supporter 160 and the second supporter 170. In addition, the third mold layer 156 may include a material that also has etch selectivity with respect to the first mold layer 152 and the second mold layer 154. In some example embodiments, in a case where the LAL lift-off process is performed, the third mold layer 156 may have an etch rate with respect to the LAL, wherein the etch rate is higher than those of the first and second supporters 160 and 170 but is lower than those of the first and second mold layers 152 and 154. The third mold layer 156 may protect the lower surface of the first supporter 160 and the upper surface of the second supporter 170 against the damage caused due to the dry etching and/or the wet etching.

That is, after the dry etching and/or wet etching process, the lower surface of the first supporter 160 and the upper surface of the second supporter 170 may have flat profiles, and have an increased contact area to the electrode structures 200 as compared with the shape caused by the etching damage. Thus, margins with respect to the isolation of the supporters or cracks may be increased.

The third mold layer 156 may include SiN, SiON, or SiN or SiON doped with C, B, or P, but example embodiments of the inventive concepts are not limited thereto. As an example, when the first and second supporters 160 and 170 may include SiCN and the third mold layer 156 includes SiN, the third mold layer 156 may prevent a bowing effect from generating in the side surface portion of the electrode structure 200 exposed between the first and second supporters 160 and 170 during the post wet-etching process, so that the electrode structure 200 may have an even profile.

Figure 5:
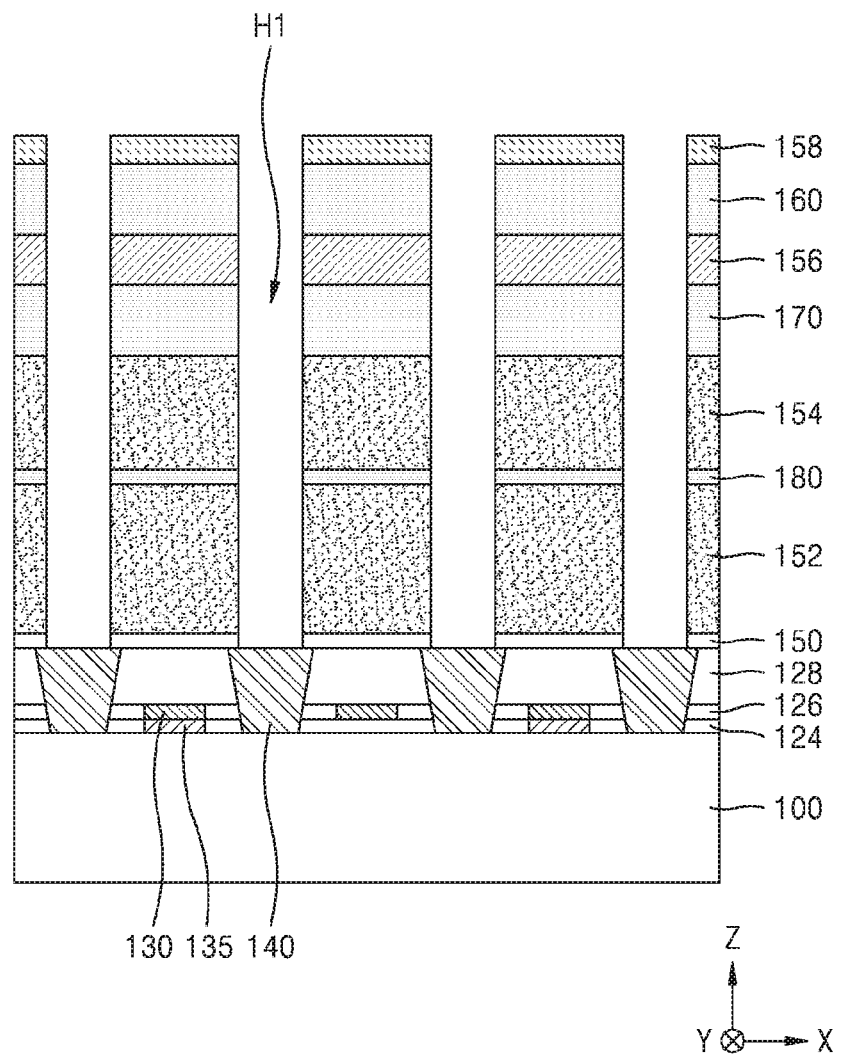

Referring to FIG. 5, on portions where the electrode structures 200 are to be formed, the hard mask layer 158, the first supporter 160, the third mold layer 156, the second supporter 170, the second mold layer 154, the third supporter 180, and the first mold layer 152 are etched by using the first mask pattern 190 (see FIG. 4) as an etching mask to form a plurality of first holes H1 penetrating the above layers. In the above etching process, the etch stop layer 150 may be used to stop the etching. After forming the first holes H1, the etch stop layer 150 exposed on bottom surfaces of the first holes H1 is also removed to expose the capacitor contact plugs 140.

Figure 6:
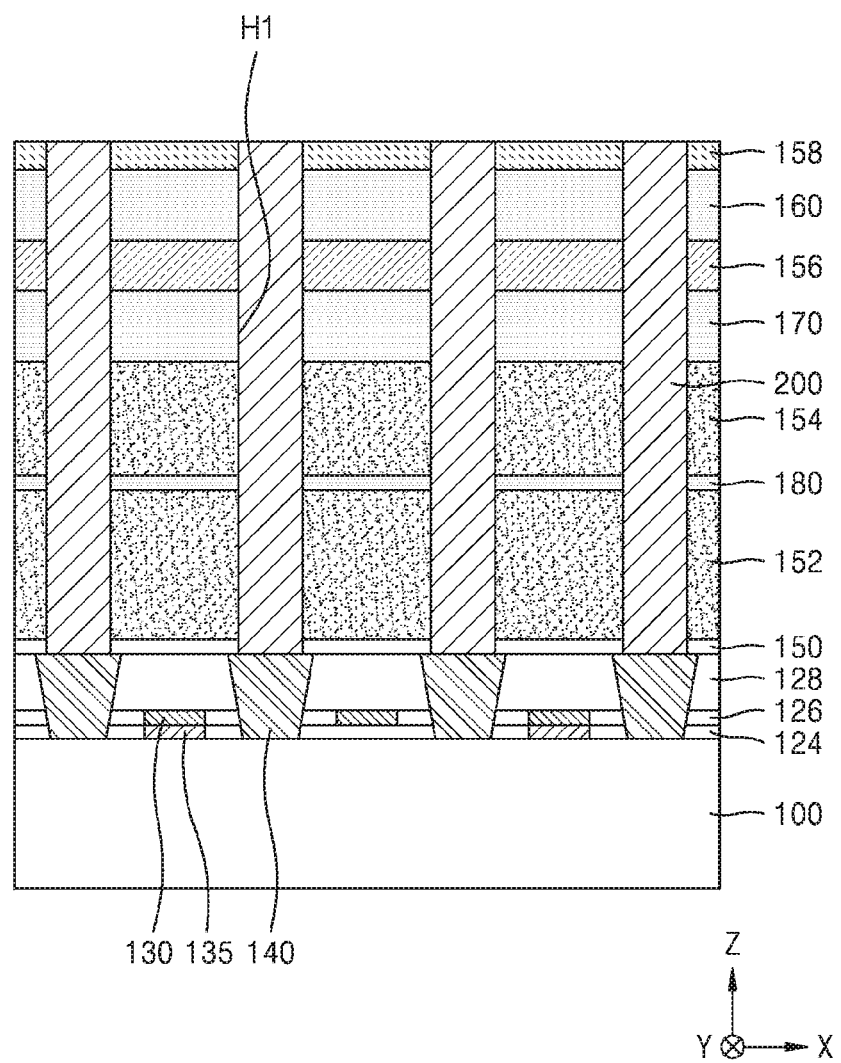

Referring to FIG. 6, a conductive material is embedded in the first holes H1 to form the electrode structures 200. The conductive material may include, for example, at least one of doped polysilicon, silicon germanium (SiGe), TiN, W, Ti, Ru, and WN. In some example embodiments, the electrode structure 200 may include an oxide-based conductive material such as ruthenium oxide ($RuO_x$).

Figure 7:
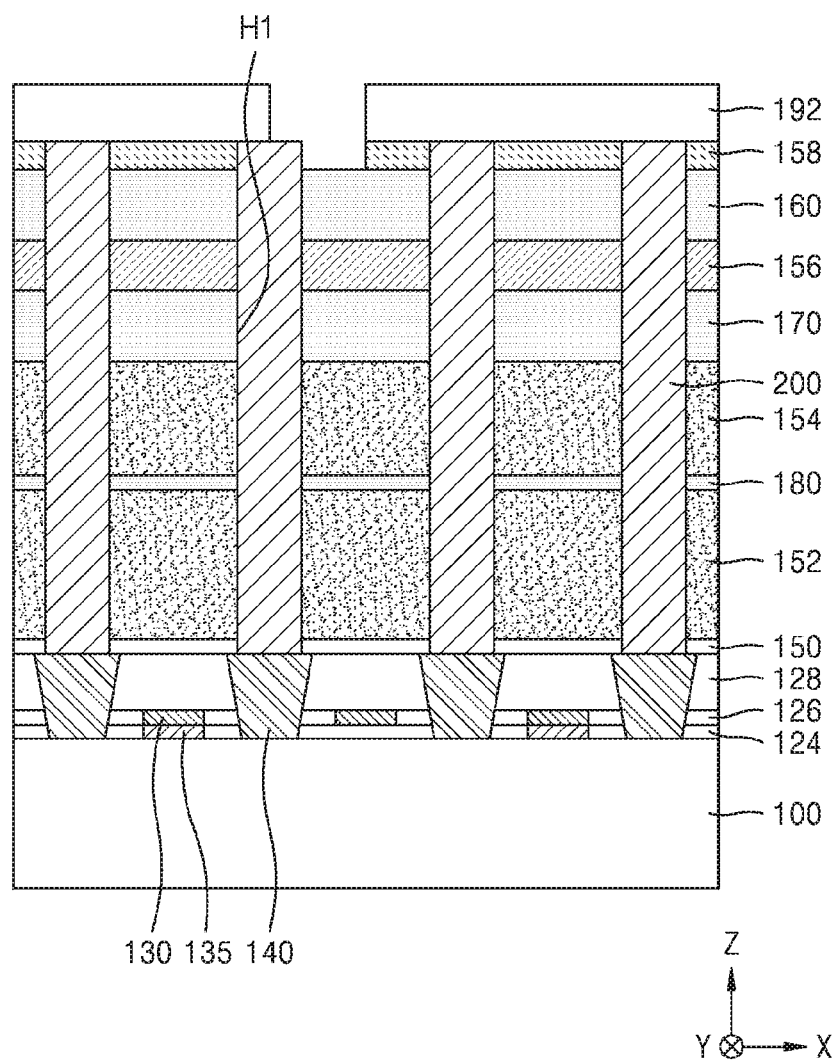

Referring to FIG. 7, a second mask pattern 192 for forming an opening OP may be formed on the electrode structures 200 and the hard mask layer 158. The hard mask layer 158 is patterned by using the second mask pattern 192. For example, when the hard mask layer 158 includes a silicon oxide layer, the hard mask layer 158 may be patterned by a wet-etching or dry-etching process using an etchant that may selectively remove the silicon oxide layer.

Figure 8:
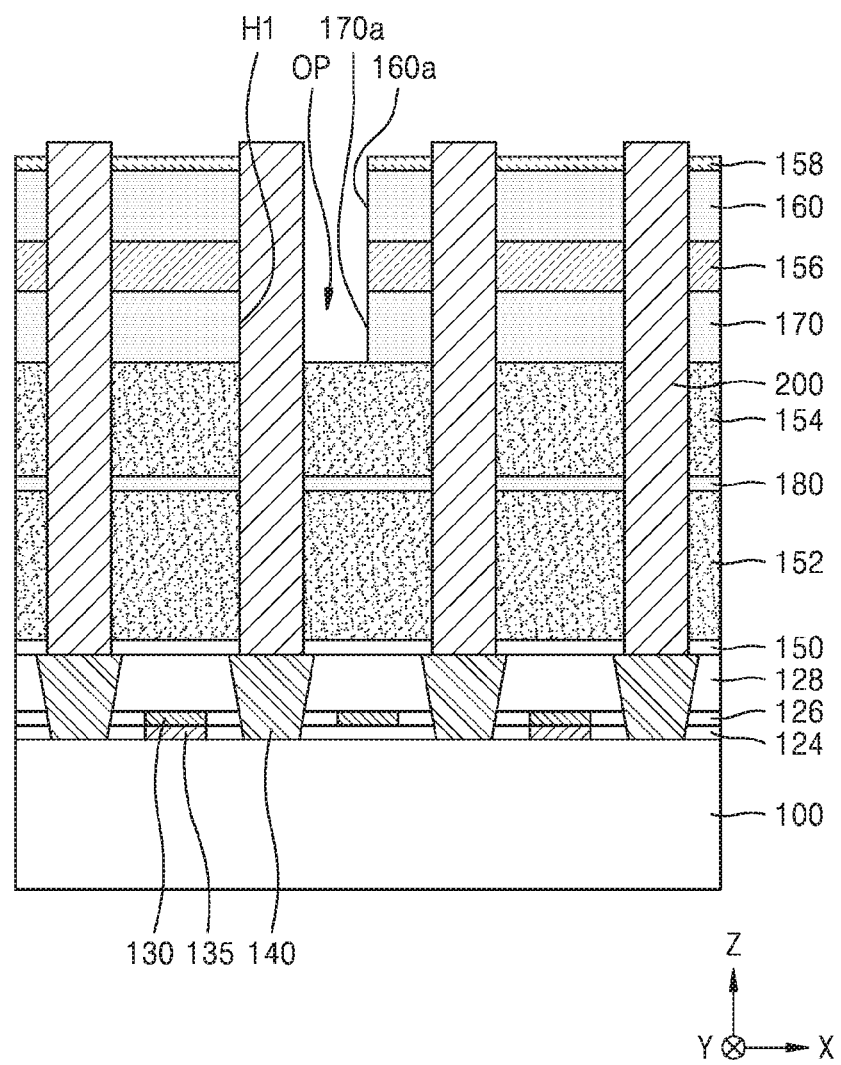

Referring to FIG. 8, the first supporter 160, the third mold layer 156, and the second supporter 170 that are exposed are removed to form the opening OP. The first supporter 160, the third mold layer 156, and the second supporter 170 that are exposed may be removed between the electrode structures 200 in the opening OP, as shown in FIG. 1.

In this process, the removing process may be performed without using an additional mask pattern. For example, in a case where the first supporter 160 includes a silicon nitride layer, the first supporter 160 may be patterned by a wet-etching or a dry-etching process using an etchant that may selectively remove the silicon nitride layer, and then, a first opening 160*a* may be formed. In this case, in the other portion than the first opening 160*a*, an upper portion of the hard mask layer 158 is partially removed, and the first supporter 160, the third mold layer 156, and the second supporter 170 are removed through the first opening 160*a* to form the opening OP. Therefore, when the hard mask layer 158 is formed as described above with reference to FIG. 7, a thickness of the hard mask layer 158 may be determined taking into account the present process. That is, the thickness of the hard mask layer 158 may be determined so that the first supporter 160 except the first opening 160*a* may not be removed until all of the first supporter 160, the third mold layer 156, and the second supporter 170 in the opening OP are removed. If the hard mask layer 158 remains, the hard mask layer 158 may be removed through an additional process.

The first opening 160a may be repeatedly and regularly formed in the first supporter 160, and a second opening 170a may also be repeatedly and regularly formed in the second supporter 170. For example, the first and second openings 160a and 170a may be formed as rectangles, but are not limited thereto, that is, the first and second openings 160a and 170a may be formed as parallelograms, trapezoid, triangles, or circles.

Through the process of removing the first supporter 160, the third mold layer 156, and the second supporter 170, the second mold layer 154 is partially exposed through the opening OP. Post-processes may be performed on portions under the first or second supporter 160 or 170 through the opening OP.

Figure 9:
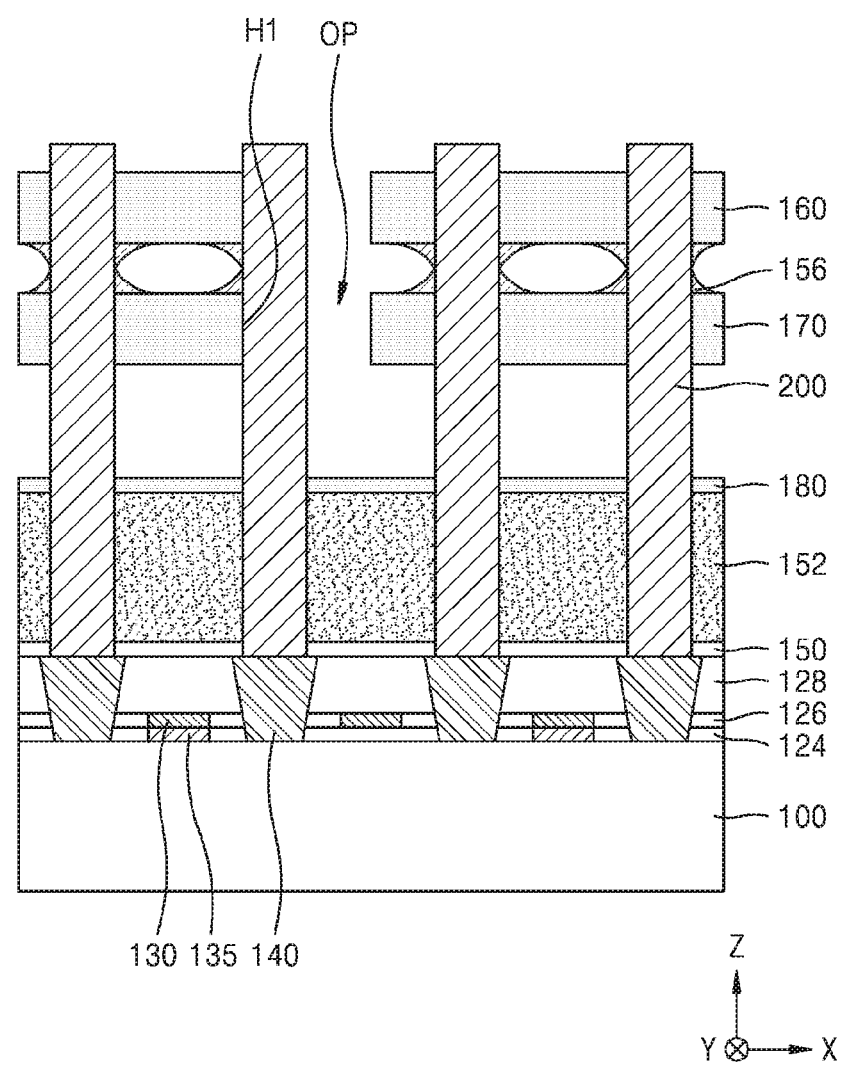

Referring to FIG. 9, the remaining portion of the hard mask layer 158 (see FIG. 8), a part of the third mold layer 156, and the second mold layer 154 may be removed. For example, when the hard mask layer 158 includes a silicon oxide layer, the hard mask layer 158 may be removed through a wet-etching or a dry-etching process using an etchant that may selectively remove the silicon oxide layer. After or simultaneously with the removing of the hard mask layer 158, a part of the third mold layer 156 and the second mold layer 154 may be removed by providing the etchant through the opening OP. If the second mold layer 154 includes a silicon oxide layer, the second mold layer 154 and a part of the third mold layer 156 may be removed through the wet-etching or dry-etching process using an etchant that may selectively remove the silicon oxide layer. According to the embodiment, the hard mask layer 158 and the second mold layer 154 may include an oxide layer (e.g., silicon oxide layer), and the third mold layer 156 may include the silicon nitride layer. In some example embodiments, the third mold layer 156 may include a bowing block SiN (B-SiN) or a bowing block SiON (B-SiON), which may be doped with C, B, or P. Therefore, the LAL lift-off process using a LAL solution including ammonium fluoride ($NH_4F$), hydrofluoric acid (HF), and water may be performed to remove the hard mask layer 158, a part of the third mold layer 156, and the second mold layer 154 together.

According to the LAL lift-off process, an upper space for separating the first supporter 160 from the second supporter 170 and an intermediate space for separating the second supporter 170 from the third supporter 180 may be generated. The electrode structures 200 are supported by the first and second supporters 160 and 170, and side walls of the electrode structures 200 may be partially exposed through the opening OP.

Figure 10:
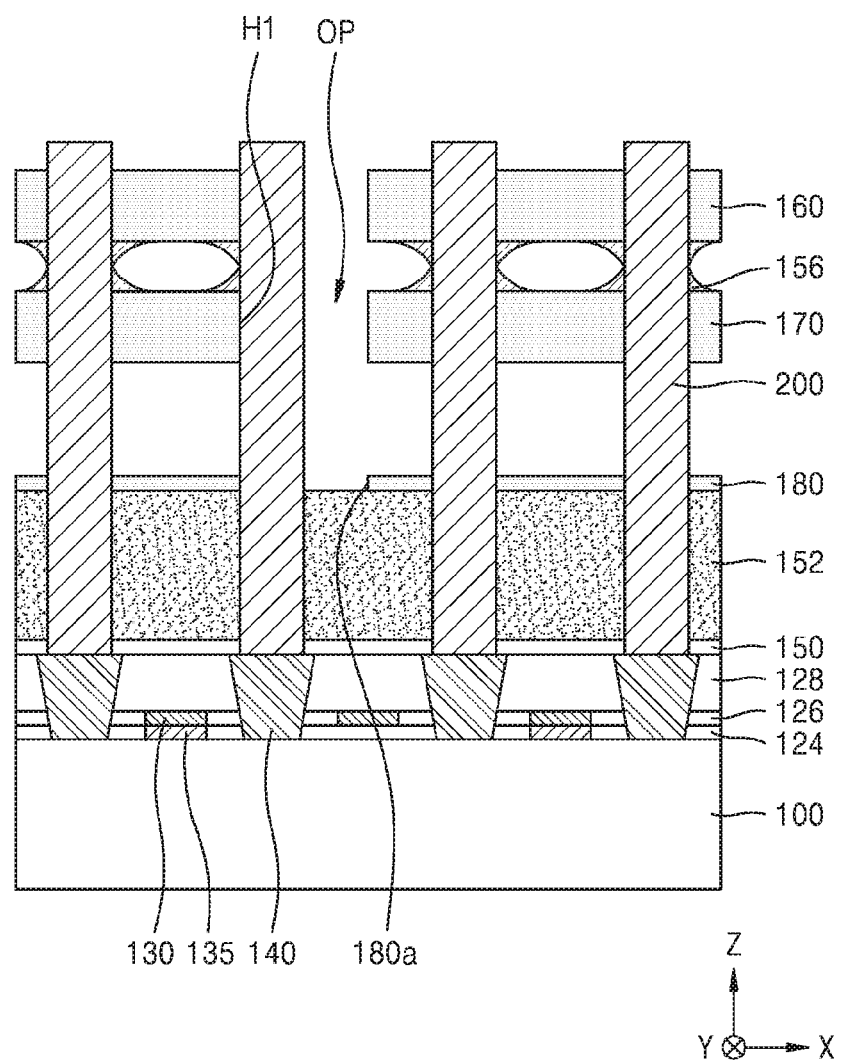

Referring to FIG. 10, the third supporter 180 is patterned to form a third opening 180a. For example, an etchant is provided through the opening OP so that the third supporter 180 that is exposed through the opening OP may be partially removed by the wet-etching or dry-etching to form a third opening 180a pattern in the third supporter 180. According to an example embodiment, shapes of the first and second openings 160a and 170a may be transferred to the third supporter 180 without performing additional photo processes so as to form the third supporter 180. Accordingly, the third opening 180a may be formed in the third supporter 180, in a shape similar to or the same as those of the first and second openings 160a and 170a. The third opening 180a in the third supporter 180 may partially expose the first mold layer 152, and partially expose the side walls of the electrode structures 200.

When the third opening 180a of the third supporter 180 is formed, the etchant attacks the first supporter 160, and accordingly, a part of the first supporter 160, e.g., an upper portion of the first supporter 160, may be lost and may be reduced in thickness thereof. A loss amount of the first supporter 160 may vary depending on an etching rate of the first supporter 160. Therefore, a thickness of the first supporter 160 may be appropriately set, taking into account the loss amount of the first supporter 160 while the third supporter 180 is patterned by, for example, an etch-back process. Since the upper portion of the first supporter 160 is partially lost, upper end portions of the electrode structures 200 may protrude more than the upper surface of the first supporter 160.

Figure 11:
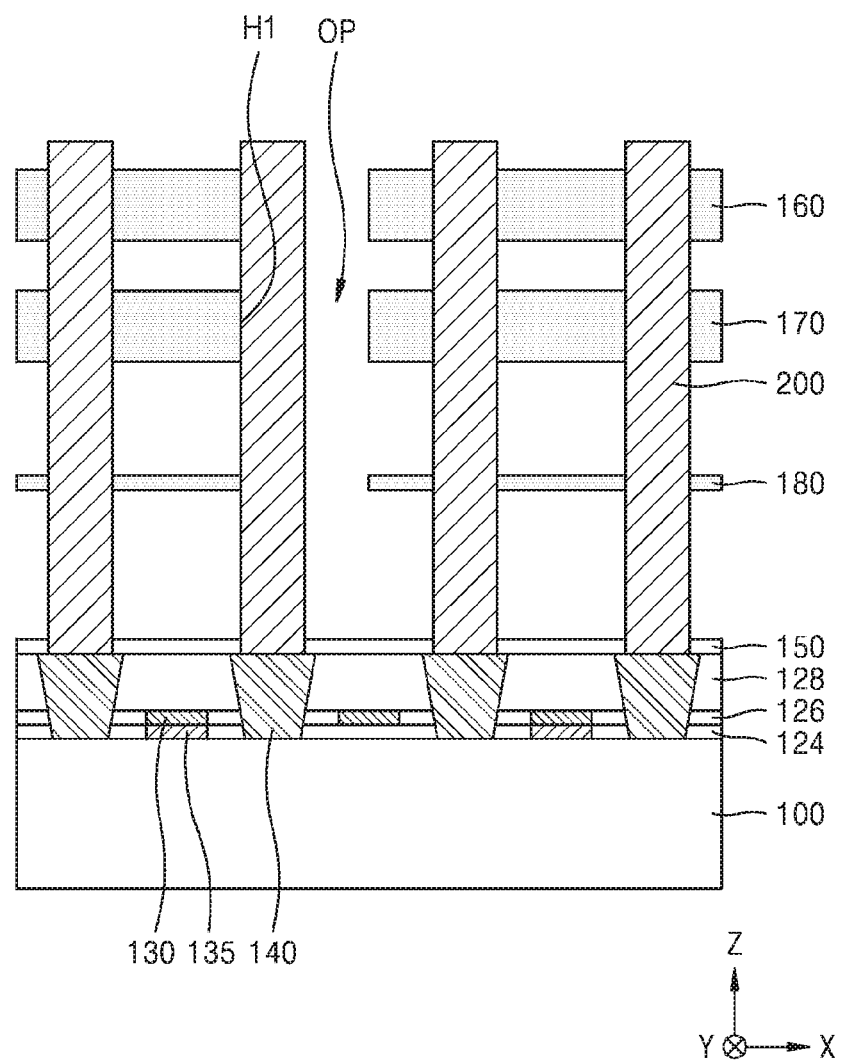

Referring to FIG. 11, an etchant may be provided through the third opening 180a of the third supporter 180 so as to remove the third mold layer 156 (see FIG. 10) and the first mold layer 152 (see FIG. 10) that are remained. For example, if the first mold layer 152 includes a silicon oxide layer, the first mold layer 152 may be removed by the wet-etching or dry-etching process using an etchant that may selectively remove the silicon oxide layer. The first mold layer 152 may include, for example, an oxide layer (e.g., silicon oxide layer). Therefore, the LAL lift-off process using a LAL solution including $NH_4F$, HF, and water may be performed to remove the third mold layer 156 that remains (see FIG. 10), and the first mold layer 152 (see FIG. 10) together.

According to the LAL lift-off process, a lower space for separating the third supporter 180 from the etch stop layer 150 may be generated. According to the embodiment, through two LAL lift-off processes, the lower space between the third supporter 180 and the etch stop layer 150, the intermediate space between the second supporter 170 and the third supporter 180, and the upper space between the first supporter 160 and the second supporter 170 may be generated.

The first to third supporters 160, 170, and 180 of mesh types are separate from one another by the upper space and the intermediate space, and may configure a triple-structured supporter that supports upper and lower sides of the electrode structure 200 while partially surrounding the side wall of the electrode structure 200 that extends in a Z-axis direction. The first to third supporters 160, 170, and 180 may be arranged up and down in the Z-axis direction, in which the electrode structure 200 extends. The first supporter 160 may include Y patterns extending in a Y-axis direction and X patterns extending in an X-axis direction. The X-axis direction may be perpendicular to the Y-axis direction. The Y patterns contact the electrode structures 200 to support the electrode structures 200, and the X patterns support the electrode structures 200, and at the same time, connect the Y patterns to one another. Accordingly, robustness of the first supporter 160 and property for supporting the electrode structures 200 may be ensured. This will be applied to the second and third supporters 170 and 180, as well.

In the present specification, the triple-structured supporter is mainly described, but one or more example embodiments are not limited thereto, that is, other example embodiments relate to a supporter having a quadruple or greater structure.

Figure 12:
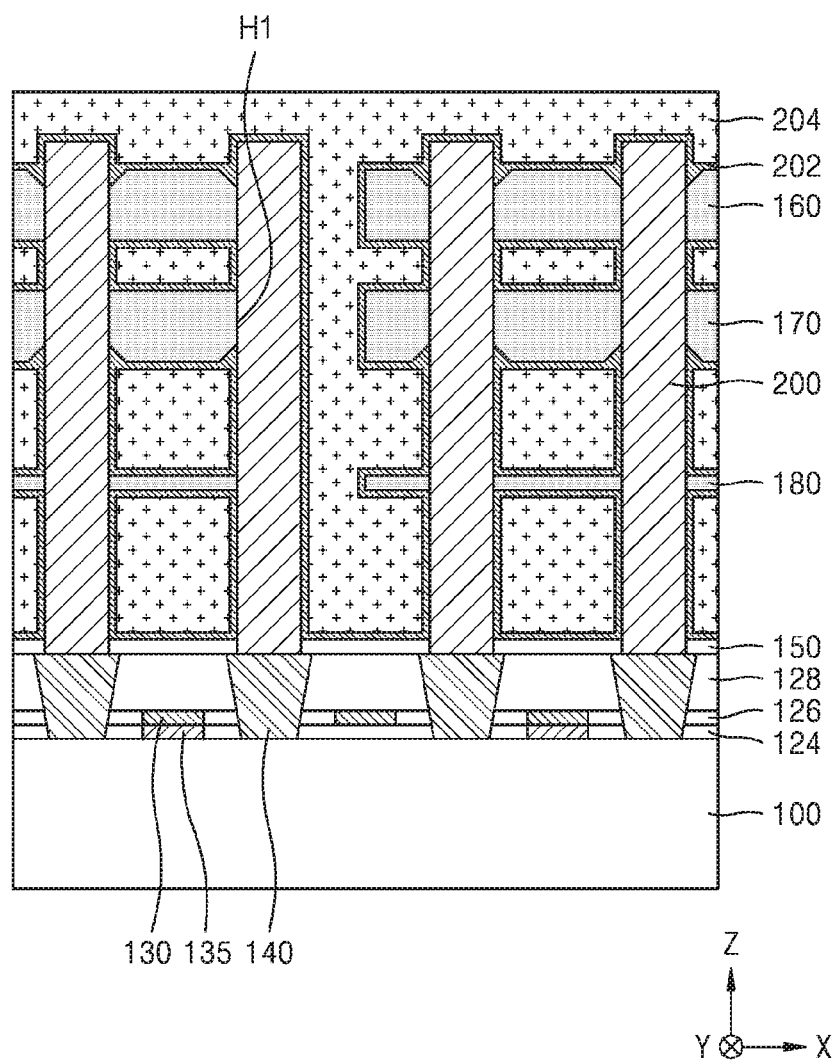

Referring to FIG. 12, a dielectric layer 202 and an upper electrode 204 may be formed along surfaces of the electrode structures 200. The dielectric layer 202 and the upper electrode 204 may be formed along exposed surfaces of the first to third supporters 160, 170, and 180 and exposed surfaces of the electrode structures 200. According to the above series of processes, a capacitor having the electrode structures 200 and the upper electrode 204, which face each other as the dielectric layer 202 is interposed therebetween, is formed on the substrate 100, and a semiconductor device such as DRAM including a triple supporter for supporting the electrode structures 200 may be implemented. The dielectric layer 202 may be formed by stacking a metal oxide layer on a metal nitride layer by a chemical vapour deposition (CVD) method or an atomic layer deposition (ALD) method. The dielectric layer 202 is not limited to a dual-layered structure, but may have a triple or more layered structure. The metal nitride layer may include an aluminum nitride (AlN) layer, a boron nitride (BN) layer, a zirconium nitride ($Zr_3N_4$) layer, or a hafnium nitride ($Hf_3N_4$) layer, but is not limited thereto. The metal oxide layer may be a single layer selected from the group consisting of a $ZrO_2$ layer, an $HfO_2$ layer, and a $Ta_2O_3$ layer, or a combination thereof, but example embodiments are not limited thereto.

For example, the upper electrode 204 is formed on the dielectric layer 202. The upper electrode 204 may include, for example, TIN, TiAlN, TAN, W, WN, Ru, $RuO_2$, $SrRuO_3$, Ir, $IrO_2$, platinum, or a combination thereof, but example embodiments are not limited thereto. The upper electrode 204 may be formed by the CVD method.

According to an example embodiment, the triple supporters may support the electrode structures 200 from upper and lower portions, and accordingly, even when the electrode structures 200 are formed as large as possible in vertical heights, leaning of the electrode structures 200 may be prevented or restrained. In addition, the electrode structures 200 are exposed between the first supporter 160 and the second supporter 170 to be used as a capacitor, and a cell capacitance, or Cs gain may be ensured as much as possible.

Figure 13:
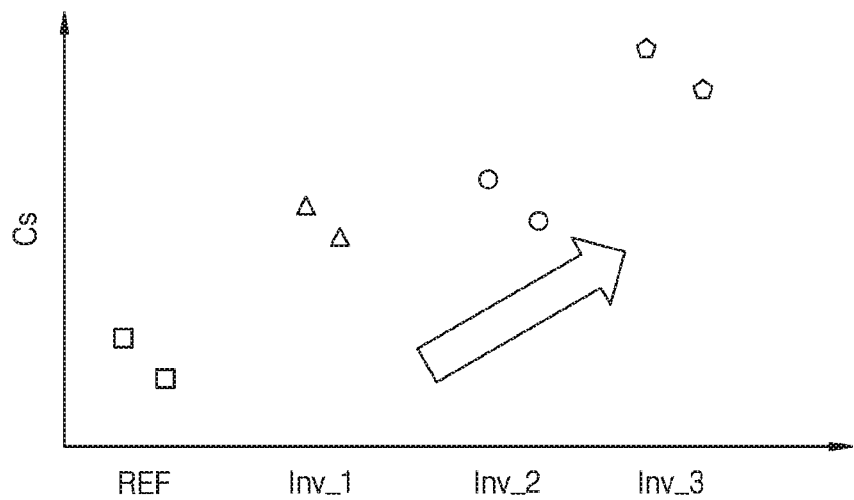
FIG. 13 is a graph of cell capacitance, or Cs, gains versus semiconductor devices according to one or more example embodiments.

Referring to FIG. 13, a graph shows a Cs gain versus a thickness of the third mold layer 156 according to the embodiment.

In the graph of FIG. 13, x axis denotes semiconductor devices having the third mold layer 156 of different thicknesses, wherein the third mold layer 156 includes SiN, with respect to the semiconductor device (REF) having no third mold layer 156, as variables. In addition, y axis denotes Cs gains with respect to the semiconductor devices. Here, the thickness of the third mold layer 156 and the Cs gain increase in arrow directions of the x axis and the y axis. That is, the thickness of the third mold layer 156 may be arranged in an order of Inv_1<Inv_2<Inv_3.

Through the above graph, as the thickness of the third mold layer 156 increases, that is, a distance between the first supporter 160 and the second supporter 170 increases, exposed portions of the electrode structures 200 increase and an area of the lower electrode in the capacitor increases, and accordingly, the Cs gain increases. That is, according to example embodiments, the semiconductor device may be implemented while reducing a propensity or preventing collapse of the electrode structures 200 and adjusting an optical thickness of the third mold layer 156 for ensuring maximum Cs gain.

Figure 14:
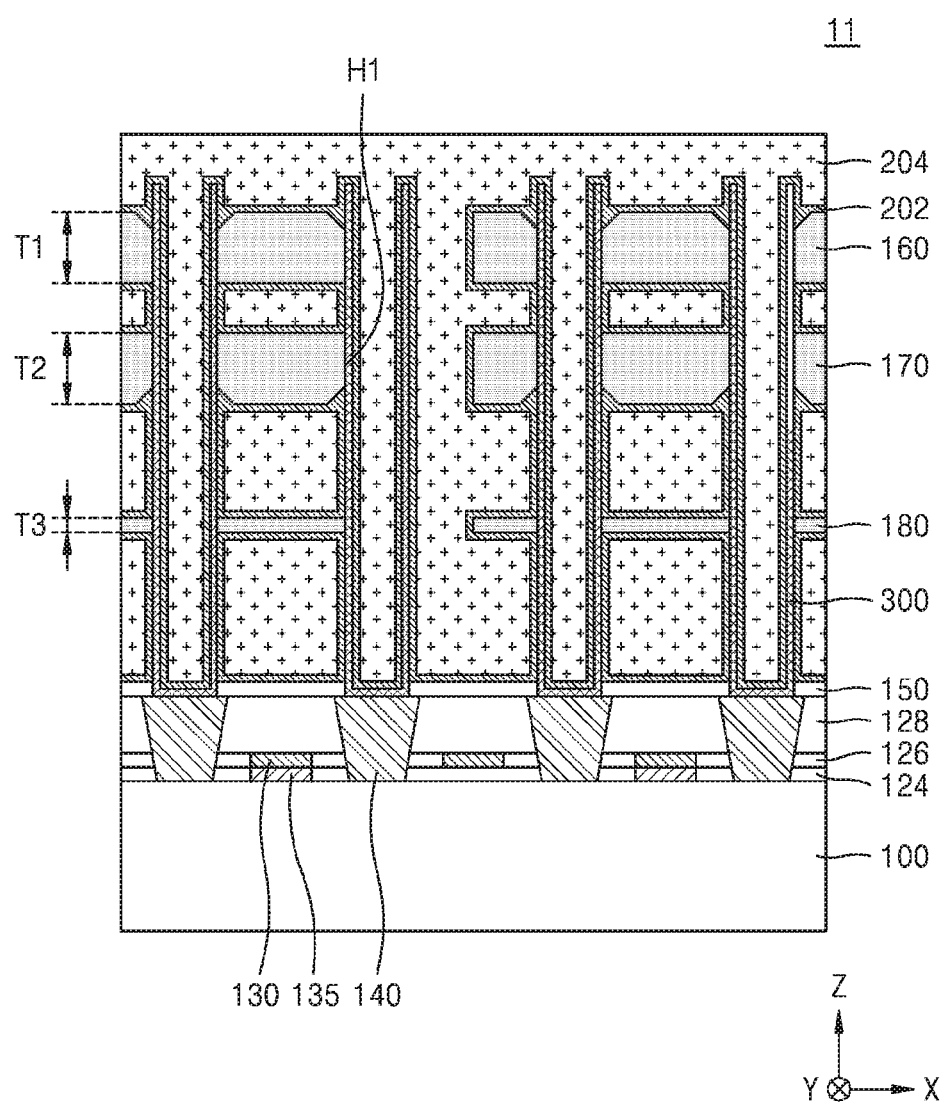
FIG. 14 is a cross-sectional view of a part of a semiconductor device according to an example embodiment.

FIG. 14 is a cross-sectional view of a semiconductor device, in which arrangements of electrode structures 300 and supporters are schematically shown, according to an example embodiment.

In FIG. 14, like reference numerals as FIG. 12 denote the same elements. Referring to FIG. 14, each of a plurality of electrode structures 300 of the embodiment may be formed as a hollow cylindrical type. When the electrode structure 300 is formed as a hollow cylindrical type capacitor, an upper surface, an external surface, and an internal surface of the electrode structure 300 may be all used as capacitor regions, and accordingly, an amount of a conductive material for forming the electrode structure 300 may be reduced. The electrode structure 300 may include, for example, at least one of TiN, W, Ti, Ru, and WN. In some example embodiments, the electrode structure 300 may include an oxide-based conductive material such as RuOx. The electrode structure 300 may be formed by a metal organic CVD method.

The electrode structure 300 may be connected to source/drain regions (not shown) in the substrate 100 via a capacitor contact plug 140 in a predetermined region. In the embodiment, the electrode structure 300 is shown to be directly connected to the substrate 100 via the capacitor contact plug 140, but is not limited thereto. For example, the electrode structure 300 may be connected to the substrate 100 via at least one contact pad (not shown) and/or at least one contact plug (not shown).

The first supporter 160, the second supporter 170, and the third supporter 180 may be located between upper and lower ends of the plurality of electrode structures 300. The first to third supporters 160, 170, and 180 may prevent the electrode structures 300, each having a large aspect ratio, from leaning. The first and second supporters 160 and 170 may form an upper supporter group, and the third supporter 180 may form a lower supporter. The first to third supporters 160, 170, and 180 support the electrode structures 300 by partially contacting side surfaces of the electrode structures 300. The first to third supporters 160, 170, and 180 may each have a plate-type shape disposed in parallel with an upper surface of the substrate 100 at a predetermined height of the electrode structures 300.

As shown in FIG. 14, the first to third supporters 160, 170, and 180 may be respectively disposed at desired, or alternatively predetermined heights of the electrode structures 300. For example, the first and second supporters 160 and 170 may be located higher than a center of the electrode structures 300 in a perpendicular direction, separating from opposite ends of the electrode structures 300 in the z-axis direction. In addition, the third supporter 180 may be located at a lower end portion, that is, lower than the center of the electrode structures 300. The first and second supporters 160 and 170 may be spaced from each other in a perpendicular direction. In some example embodiments, the first supporter 160 may be located slightly lower than an upper end portion of the electrode structures 300.

In another example embodiment, the first supporter 160 may be disposed so that an upper surface of the first supporter 160 and the upper surfaces of the electrode structures 300 are at the same level, and thus, the electrode structures 300 may not protrude upward. In addition, the number of supporters is not limited to the above example, but four or more supporters may be arranged.

The first and second supporters 160 and 170 may include the same material as each other. The thickness Ti of the first supporter 160 and the thickness T2 of the second supporter 170 may be equal to or different from each other. In another example embodiment, the first and second supporters 160 and 170 may have multi-layered structures.

The first and second supporters 160 and 170 may include a material having etch selectivity with respect to a mold layer (not shown) for forming the electrode structures 300. In some example embodiments, when the LAL lift-off process is used in a post-process for removing the mold layer (not shown), a material having a lower etch rate with respect to the LAL and having dielectric characteristics may be used to form the first and second supporters 160 and 170. For example, the first and second supporters 160 and 170 may include one of SiN, SiCN, TaO, and TiO$_2$, but are not limited thereto.

In one example embodiment, the first and second supporters 160 and 170 may include SiCN. In SiCN, a carbon rate may range from 0.1 atom % to 15 atom %. When the first and second supporters 160 and 170 include carbon, warpage of the first and second supporters 160 and 170 may be reduced.

The thickness T3 of the third supporter 180 may be less than those Ti and T2 of the first and second supporters 160 and 170. In another example embodiment, the third supporter 180 may include a multi-layered structure. The third supporter 180 may include a material having etch selectivity with respect to a mold layer (not shown) for forming the electrode structures 300. In some example embodiments, when the LAL lift-off process is used in a post-process for removing the mold layer (not shown), a material having a lower etch rate with respect to the LAL and having dielectric characteristics may be used to form the third supporter 180. For example, the third supporter 180 may include one of SiN, SiCN, TaO, and TiO$_2$, but is not limited thereto.

In one example embodiment, the third supporter 180 may include SiCN. In SiCN, a carbon rate may range from 0.1 atom % to 15 atom %. When the third supporter 180 includes carbon, warpage of the third supporter 180 may be reduced.

Referring to FIG. 14, an upper surface of the first supporter 160 and a lower surface of the second supporter 170 may have profiles that vary depending on distances to the electrode structures 300. Due to the variation in the profiles, the thickness of the first and second supporters 160 and 170 may be reduced towards the electrode structures 300.

The upper surface of the first supporter 160 may be damaged by the dry-etching and/or the wet-etching, and the lower surface of the second supporter 170 may be damaged due to the wet-etching. Unlike the upper surface of the first supporter 160 and the lower surface of the second supporter 170 having the damages, the lower surface of the first supporter 160 and the upper surface of the second supporter 170 may have flat profiles. That is, during the manufacturing processes of the semiconductor device according to the one or more embodiments, a mold layer (not shown) may be formed between the first supporter 160 and the second supporter 170 so as to protect the lower surface of the first supporter 160 and the upper surface of the second supporter 170 against damage caused by the etching processes and to form the flat profiles. Accordingly, a contact area may be increased comparing with the shapes obtained due to the etching damage, and thus, margins with respect to the isolation of the supporter or the crack may be improved. In addition, in one example embodiment, when the first and second supporters 160 and 170 include SiCN and the first and second supporters 160 and 170 are formed by removing the mold layer (not shown) therebetween through the wet-etching process, a bowing effect may be prevented from occurring on the side surfaces of the electrode structures 300, which are exposed between the first and second supporters 160 and 170, during a post wet etching process, so that the exposed side surfaces of the electrode structures 300 may have uniform profiles.

Figure 15:
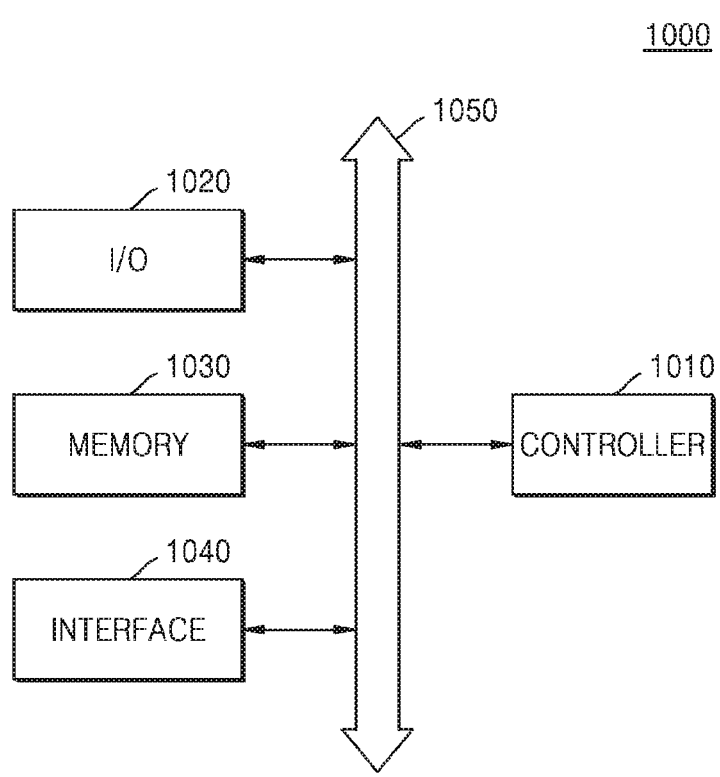
FIG. 15 is a block diagram of an electronic system including a semiconductor device according to an example embodiment.

FIG. 15 is a diagram of a system 1000 including a semiconductor device manufactured according to an example embodiment.

In detail, the system 1000 according to an example embodiment may include a controller 1010, an input/output device (I/O) 1020, a memory device 1030, an interface 1040, and a bus 1050. The controller 1010, the I/O 1020, the memory device 1030, and/or the interface 1040 may be connected to one another via the bus 1050. The bus 1050 corresponds to a path through which data is transferred. The system 1000 may be a mobile system or a system sending/receiving information. In some example embodiments, the mobile system may be applied to a personal digital assistant (PDA), a portable computer, a web tablet, a wireless phone, a mobile phone, a digital music player, a memory card, or all kinds of electronic appliances capable of wirelessly transmitting and/or receiving information.

The controller 1010 controls execution programs in the system 1000, and may include a microprocessor, a digital signal processor, a microcontroller, or similar devices. The I/O 1020 may input or output data to/from the system 1000. The system 1000 may be connected to an external device, e.g., a personal computer or a network, via the I/O 1020, and may exchange data with the external device. The I/O 1020 may include, for example, a keypad, a keyboard, or a display.

The memory device 1030 stores codes and/or data for operating the controller 1010, or data processed by the controller 1010. The memory device 1030 may include the semiconductor device according to one or more embodiments. For example, the memory device 1030 may include at least one of the semiconductor devices manufactured by the above-described methods. Therefore, the memory device 1030 may have a plurality of cells with a higher Cs.

The interface 1040 may be a data transmission path between the system 1000 and an external device. The controller 1010, the I/O 1020, the memory device 1030, and the interface 1040 may communicate with one another via the bus 1050.

The system 1000 according to example embodiments may be used, for example, in a mobile phone, an MP3 player, a navigation system, a portable multimedia player (PMP), a solid state disk (SSD), and/or household appliances. However, example embodiments are not limited thereto.

While some of the inventive concepts have been particularly shown and described with reference to embodiments thereof, it will be understood that various changes in form and details may be made therein without departing from the spirit and scope of the following claims.

What is claimed is:

1. A semiconductor device comprising:
   a plurality of electrode structures on a substrate, the plurality of electrode structures having side surfaces; and
   a first supporter and a second supporter between upper ends and lower ends of the plurality of electrode structures, respectively, the first supporter having a first upper surface and a first lower surface, the first supporter having a first thickness between the first upper surface and the first lower surface,
   wherein one of the first upper surface and first lower surface has a curved profile, and the other of the first upper surface and first lower surface has a flat profile, and
   the first supporter has the first thickness that decreases towards the plurality of electrode structures.

2. The semiconductor device of claim 1, wherein the second supporter is closer to the substrate than the first supporter.

3. The semiconductor device of claim 1, wherein the first supporter is separated from the second supporter.

4. The semiconductor device of claim 1, wherein a thickness of the second supporter is less than a thickness of the first supporter.

5. The semiconductor device of claim 1, wherein the first supporters has an opening.

6. The semiconductor device of claim 1, wherein the second supporter includes an opening.

7. The semiconductor device of claim 1, wherein the first upper surface has a curved profile, and the first lower surface has a flat profile.

8. The semiconductor device of claim 1, wherein the first upper surface contacts the side surfaces at an angle greater than a right angle.

9. The semiconductor device of claim 1, wherein the second supporter has an second upper surface and a second lower surface, the second supporter having a second thickness between the second upper surface and the second lower surface,
wherein one of the second upper surface and the second lower surface has a flat profile, and the other of the second upper surface and the second lower surface has a curved profile.

10. The semiconductor device of claim 9, wherein the second supporter has the second thickness that decreases towards the plurality of electrode structures.

11. The semiconductor device of claim 9, wherein the first lower surface and the second upper surface have flat profile.

12. A semiconductor device comprising:
a plurality of electrode structures on a substrate;
a first supporter, and a second supporter separated from the other between upper ends and lower ends of the plurality of electrode structures;
a dielectric layer on the plurality of electrode structures; and
an upper electrode on the dielectric layer,
wherein an upper surface of the first supporter have curved profiles, and a lower surface of the first supporter have relatively flat profiles as compared with the upper surface of the first supporter,
the first supporter has a first thickness from the upper surface of the first supporter to the lower surface of the first supporter, the first thickness decreases towards the plurality of electrode structures, and
the second supporter is at lower level than an intermediate portion of each of the plurality of electrode structures.

13. The semiconductor device of claim 12, wherein the upper surface of the first supporter has a convex profile.

14. The semiconductor device of claim 12, wherein the first supporter and the second supporter include a substantially similar material.

15. The semiconductor device of claim 12, further comprising a wherein
a third supporter between the first supporter and the second supporter, and
a distance between the first supporter and the third supporter is less than a distance between the second supporter and the third supporter.

16. The semiconductor device of claim 15, wherein a thickness of the second supporter is less than a thickness of each of the first supporter and the third supporter.

17. The semiconductor device of claim 15, wherein the first supporter and the third supporter include silicon carbon nitride.

18. A semiconductor device comprising:
a substrate;
an electrode perpendicular to the substrate;
a first supporter having a top surface and a bottom surface, the bottom surface of the first supporter being substantially parallel to the substrate such that the bottom surface of the first supporter is connected substantially at right angles to the electrode, the top surface having a different profile from the bottom surface; and
a second supporter being closer to the substrate than the first supporter, wherein the first supporter have a thickness that decreases towards the electrode, and
the first supporter includes silicon carbon nitride.

19. The semiconductor device of claim 18, wherein a percentage of carbon in the silicon carbon nitride is between 0.1 atom % to 15 atom %.

20. The semiconductor device of claim 18, wherein the electrode includes at least one of doped polysilicon, titanium nitride, tungsten, titanium, ruthenium, and tungsten nitride.

* * * * *

UNITED STATES PATENT AND TRADEMARK OFFICE
CERTIFICATE OF CORRECTION

PATENT NO.         : 10,490,623 B2                                      Page 1 of 1
APPLICATION NO.    : 16/229950
DATED              : November 26, 2019
INVENTOR(S)        : Ha-young Yi et al.

It is certified that error appears in the above-identified patent and that said Letters Patent is hereby corrected as shown below:

On the second page, (56), Line number 17:
The cited reference reads as 'KR 2012-0007255 A', but should read --KR 2013-0007255 A--.

Signed and Sealed this
Fourth Day of February, 2020

Andrei Iancu
*Director of the United States Patent and Trademark Office*